United States Patent
Xiang

(10) Patent No.: US 12,372,822 B2
(45) Date of Patent: Jul. 29, 2025

(54) SPLICING DISPLAY PANEL

(71) Applicant: TCL CHINA STAR OPTOELECTRONICS TECHNOLOGY CO., LTD., Guangdong (CN)

(72) Inventor: Changming Xiang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/905,169

(22) PCT Filed: Jul. 29, 2022

(86) PCT No.: PCT/CN2022/109105
§ 371 (c)(1),
(2) Date: Aug. 27, 2022

(87) PCT Pub. No.: WO2024/007390
PCT Pub. Date: Jan. 11, 2024

(65) Prior Publication Data
US 2025/0076698 A1  Mar. 6, 2025

(30) Foreign Application Priority Data
Jul. 5, 2022 (CN) .......................... 202210794673.3

(51) Int. Cl.
*G02F 1/1333* (2006.01)
*G02F 1/1335* (2006.01)
*H01L 25/075* (2006.01)

(52) U.S. Cl.
CPC .... *G02F 1/13336* (2013.01); *G02F 1/133514* (2013.01); *H01L 25/0753* (2013.01)

(58) Field of Classification Search
CPC ........... G02F 1/13336; G02F 1/133514; H01L 25/0753
See application file for complete search history.

(56) References Cited

U.S. PATENT DOCUMENTS

2020/0163233 A1  5/2020  Brackley et al.
2022/0036775 A1  2/2022  Lee et al.

FOREIGN PATENT DOCUMENTS

CN    111653207 A    9/2020
CN    111830742 A    10/2020
(Continued)

OTHER PUBLICATIONS

Chinese Office Action issued in corresponding Chinese Patent Application No. 202210794673.3 dated Jun. 12, 2023, pp. 1-8.
(Continued)

*Primary Examiner* — James R Greece
*Assistant Examiner* — Jose M Diaz
(74) *Attorney, Agent, or Firm* — PV IP PC; Wei Te Chung

(57) ABSTRACT

The present application discloses a splicing display panel, and the splicing display panel includes at least one first display module and at least one second display module spliced with each other, and at least one third display module. The first display module includes a first display area and a first frame area disposed outside the first display area. The first display module includes a first substrate and a second substrate disposed opposite to the first substrate. The second substrate includes a first concave part, and the first concave part is located in the first frame area. The at least one third display module is disposed in the first concave part.

19 Claims, 3 Drawing Sheets

(56) References Cited

FOREIGN PATENT DOCUMENTS

| | | |
|---|---|---|
| CN | 211826840 U | 10/2020 |
| CN | 212934616 U | 4/2021 |
| CN | 113281928 A | 8/2021 |
| CN | 113376883 A | 9/2021 |
| CN | 113471181 A | 10/2021 |
| CN | 214669956 U | 11/2021 |
| CN | 114068605 A | 2/2022 |
| CN | 114141155 A | 3/2022 |
| CN | 114399961 A | 4/2022 |
| CN | 216696933 U | 6/2022 |
| EP | 3726282 A1 | 10/2020 |

OTHER PUBLICATIONS

Anhui Science and Technology Press pp. 380-381 Jan. 31, 2016 New developments in energy-saving lighting sources Chen, Yuming and Chen, Dahua.
International Search Report in International application No. PCT/CN2022/109105, mailed on Dec. 26, 2022.
Written Opinion of the International Search Authority in International application No. PCT/CN2022/109105, mailed on Dec. 26, 2022.
Chinese Office Action issued in corresponding Chinese Patent Application No. 202210794673.3 dated Jan. 19, 2023, pp. 1-8.

SPLICING DISPLAY PANEL

BACKGROUND OF INVENTION

Field of Invention

The present application relates to a field of display technology, and specifically to a splicing display panel.

Description of Prior Art

A micro light-emitting diode (micro-LED) display technology and a mini light-emitting diode (mini-LED) display technology have advantages of rapid response, high color gamut, high pixels per inch (PPI), low energy consumption, etc., and they have developed into one of hotspots of a future display technology.

With rapid development of an outdoor display market, a large size and high resolution have become development directions of outdoor display. Traditional splicing screens cannot eliminate seams, which affects a visual effect.

Although a seam problem can be alleviated by disposing light bars at a position where a seam is located, existing methods of arranging the light bars will have a problem of poor stability of splicing display panels.

SUMMARY OF INVENTION

An embodiment of the present application provides a splicing display panel, which is used to improve stability of the splicing display panel.

An embodiment of the present application provides a splicing display panel, which includes:
  at least one first display module and at least one second display module spliced with each other, wherein the first display module includes a first display area and a first frame area disposed outside the first display area, and the first display module includes a first substrate and a second substrate disposed opposite to the first substrate; the second substrate has a first concave part, the first concave part is located in the first frame area, and an opening of the first concave part is provided on a light-emitting side of the first display module; and
  at least one third display module disposed in the first concave part.

Alternatively, in some embodiments provided in the present application, the second display module includes a second display area and a second frame area, and the second display module includes a third substrate and a fourth substrate disposed opposite to the third substrate; the fourth substrate has a second concave part, the second concave part is located in the second frame area, and an opening of the second concave part is provided on a light-emitting side of the second display module; the first concave part and the second concave part surround to form a holding groove, and the third display module is disposed in the holding groove.

Alternatively, in some embodiments provided in the present application, the first substrate and the third substrate are driving substrates, and the second substrate and the fourth substrate are color film substrates; the second substrate includes a first base and a first color film layer disposed on a side of the first base close to the first substrate, and the first base has the first concave part; the fourth substrate includes a second base and a second color film layer disposed on a side of the second base close to the third substrate, and the second base has the second concave part.

Alternatively, in some embodiments provided in the present application, the first display module further includes a first liquid crystal layer, the first liquid crystal layer is disposed between the first substrate and the second substrate, and the first liquid crystal layer is located in the first display area; the second display module further includes a second liquid crystal layer, the second liquid crystal layer is disposed between the third substrate and the fourth substrate, and the second liquid crystal layer is located in the second display area.

Alternatively, in some embodiments provided in the present application, the first substrate includes a first driving substrate and a first display functional layer disposed on the first driving substrate, the second substrate includes a first cover plate, and the first concave part is located on the first cover plate; the third substrate includes a second driving substrate and a second display functional layer disposed on the second driving substrate, the fourth substrate includes a second cover plate, and the second concave part is located on the second cover plate.

Alternatively, in some embodiments provided in the present application, the third display module includes a driving circuit layer and a light-emitting diode (LED) chip disposed on the driving circuit layer, the driving circuit layer is disposed in the holding groove, and the LED chip is disposed on a surface of the driving circuit layer away from a bottom part of the holding groove.

Alternatively, in some embodiments provided in the present application, the third display module further includes a sealing glue, and the sealing glue covers the LED chip.

Alternatively, in some embodiments provided in the present application, a pixel spacing of the third display module is equal to a pixel spacing of the first display module and the second display module.

Alternatively, in some embodiments provided in the present application, a gap is defined at a splicing position of the first display module and the second display module, the splicing display panel further includes an optically clear adhesive, and the optically clear adhesive is filled in the gap.

Alternatively, in some embodiments provided in the present application, a width of the holding groove is equal to a width of the third display module.

Alternatively, in some embodiments provided in the present application, a side of the third display module away from a bottom part of the first concave part is flush with a side of the second substrate away from the first substrate.

The embodiment of the present application also provides a splicing display panel, which including:
  at least one first display module and at least one second display module spliced with each other, wherein the first display module includes a first display area and a first frame area disposed outside the first display area, and the first display module includes a first substrate and a second substrate disposed opposite to the first substrate, a first color film layer is disposed on the first substrate; the second substrate includes a first base, the second substrate has a first concave part, the first concave part is located in the first frame area, and an opening of the first concave part is provided on a light-emitting side of the first display module; and
  at least one third display module disposed in the first concave part.

Alternatively, in some embodiments provided in the present application, the second display module includes a second display area and a second frame area, and the second display module includes a third substrate and a fourth substrate disposed opposite to the third substrate, a second color film layer is disposed on the third substrate; the fourth substrate includes a second base, and the fourth substrate has a second concave part, the second concave part is located in the second frame area, and an opening of the second concave part is provided on a light-emitting side of the second display module; the first concave part and the second concave part surround to form a holding groove, and the third display module is disposed in the holding groove.

Alternatively, in some embodiments provided in the present application, the first display module further includes a first liquid crystal layer, the first liquid crystal layer is disposed between the first substrate and the second substrate, and the first liquid crystal layer is located in the first display area; the second display module further includes a second liquid crystal layer, the second liquid crystal layer is disposed between the third substrate and the fourth substrate, and the second liquid crystal layer is located in the second display area.

Alternatively, in some embodiments provided in the present application, the third display module includes a driving circuit layer and an LED chip disposed on the driving circuit layer, the driving circuit layer is disposed in the holding groove, and the LED chip is disposed on a surface of the driving circuit layer away from a bottom part of the holding groove.

Alternatively, in some embodiments provided in the present application, the third display module further includes a sealing glue, and the sealing glue covers the LED chip.

Alternatively, in some embodiments provided in the present application, a pixel spacing of the third display module is equal to a pixel spacing of the first display module and the second display module.

Alternatively, in some embodiments provided in the present application, a gap is defined at a splicing position of the first display module and the second display module, the splicing display panel further includes an optically clear adhesive, and the optically clear adhesive is filled in the gap.

Alternatively, in some embodiments provided in the present application, a side of the third display module away from a bottom part of the first concave part is flush with a side of the second substrate away from the first substrate.

Alternatively, in some embodiments provided in the present application, a width of the holding groove is equal to a width of the third display module.

The splicing display panel provided by the embodiment of the present application includes the at least one first display module and the at least one second display module spliced with each other, and at least one third display module. The first display module includes the first display area and the first frame area disposed outside the first display area. The first display module includes the first substrate and the second substrate disposed opposite to the first substrate. The second substrate has the first concave part, the first concave part is located in the first frame area, and the opening of the first concave part is provided on the light-emitting side of the first display module. The at least one third display module is disposed in the first concave part. In the embodiment of the present application, the first display module includes the first substrate and the second substrate, the second substrate includes the first concave part, the first concave part is located in the first frame area, and the third display module is disposed in the first concave part; therefore, the first display module bears the third display module, so that a suspended area will not exist in the third display module, thereby improving the stability of the splicing display panel.

BRIEF DESCRIPTION OF PREFERRED DRAWINGS

In order to more clearly explain technical solutions in embodiments of the present application, following will briefly introduce drawings that need to be used in description of the embodiments. It is obvious that the drawings in the following description are only some embodiments of the present application. For those skilled in the art, other drawings can be obtained according to these drawings without paying creative labor.

DETAILED DESCRIPTION OF PREFERRED EMBODIMENTS

In order to make a purpose, technical schemes and advantages of the present application more clear, following will further describe the present application in detail in combination with accompanying drawings. Please refer to schemas in the accompanying drawings, in which same component symbols represent same components. The following description is based on specific embodiments of the present application shown, which should not be considered as limiting other specific embodiments of the present application not detailed here. Words "embodiment" used in the present specification refers to an example, example or illustration.

In the description of the present application, it should be understood that azimuth or positional relationships indicated by terms "center", "longitudinal", "transverse", "length", "width", "thickness", "upper", "lower", "front", "rear", "left", "right", "vertical", "horizontal", "top", "bottom", "inner", "outer", "clockwise", and "counterclockwise" are based on azimuth or positional relationships shown in the attached drawings, which is only for convenience of describing the present application and simplifying the description, rather than indicating or implying that devices or elements referred to must have a specific azimuth, be constructed and operate in a specific azimuth, so it cannot be understood as a limitation of the present application. In addition, terms "first" and "second" are only used for descriptive purposes and cannot be understood as indicating or implying relative importance or implicitly indicating numbers of indicated technical features. Thus, features defined with "first" and "second" may explicitly or implicitly include one or more of the features. In the description of the present application, "multiple" means two or more, unless otherwise expressly and specifically defined.

Embodiments of the present application provide a splicing display panel. The following is a detailed description. It should be noted that an order of description of the following embodiments is not a limitation of a preferred order of the embodiments.

The splicing display panel provided by the present application will be described in detail through specific embodiments.

Figure 1:
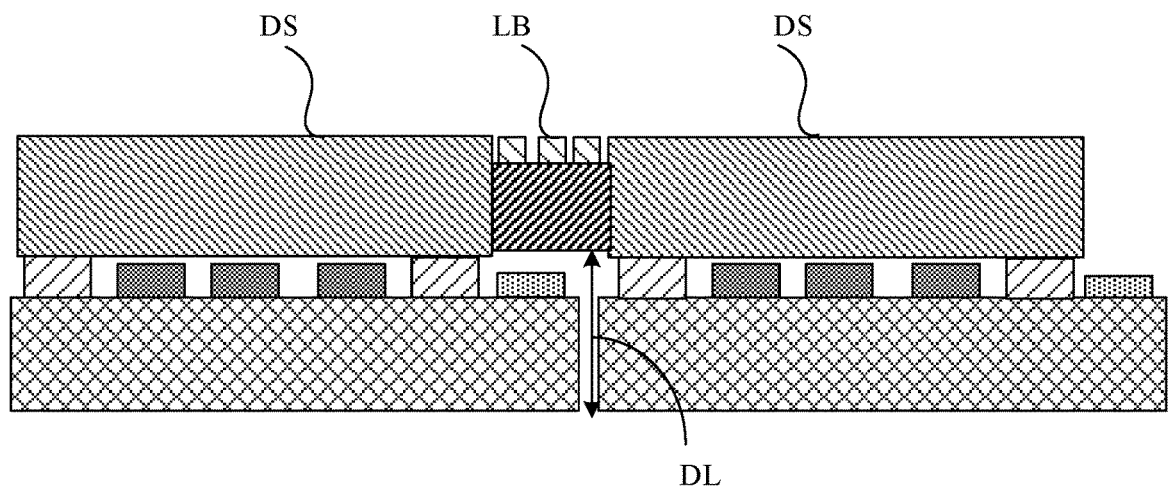
FIG. 1 is a schematic structural diagram of a splicing display panel provided by a comparative embodiment of the present application.

Please refer to FIG. 1, FIG. 1 is a schematic structural diagram of the splicing display panel provided by a comparative embodiment of the present application. There will still be a black seam in a middle area of an existing splicing display panel, which will affect appearance. In order to eliminate the seam, designers add light-emitting diode (LED) light bars LB into the seam formed between two display screens DS to achieve an effect of eliminating the seam. However, due to limitations of the seam, a frame glue width, and a bonding lead space, a pixel size and a spacing of the LED light bars LB are difficult to match pixels of the display screens DS. Moreover, since the LED light bars LB have a suspended part DL (ranging from 200 μm to 300 μm), the splicing display panel is easily misaligned after long-term use, which is prone to a problem of poor stability of the splicing display panel.

Figure 2:
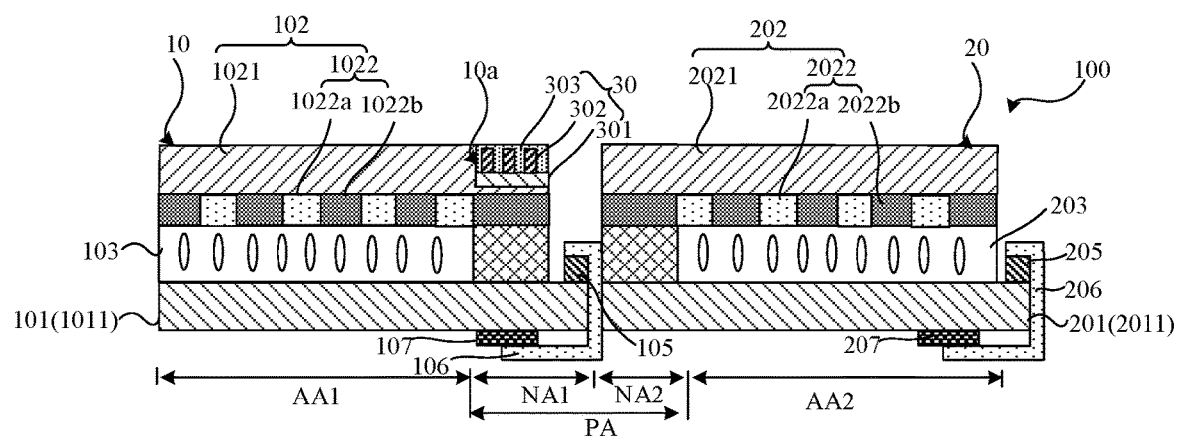
FIG. 2 is a first schematic structural diagram of a splicing display panel provided by the present application.

Please refer to FIG. 2, FIG. 2 is a first schematic structural diagram of the splicing display panel provided by the present application. The splicing display panel 100 provided by the embodiment of the present application includes at least one first display module 10 and at least one second display module 20 spliced with each other, and at least one third display module 30. The first display module 10 includes a first display area AA1 and a first frame area NA1 disposed outside the first display area AA1. The first display module 10 includes a first substrate 101 and a second substrate 102 disposed opposite to the first substrate 101. The second substrate 102 has a first concave part 10a, the first concave part 10a is located in the first frame area NA1, and an opening of the first concave part 10a is provided on a light-emitting side of the first display module 10. The at least one third display module 30 is disposed in the first concave part 10a.

In the embodiment of the present application, the first display module 10 includes the first substrate 101 and the second substrate 102; the second substrate 102 has the first concave part 10a, the first concave part 10a is located in the first frame area NA1, and the third display module 30 is disposed in the first concave part 10a. Therefore, the first display module 10 bears the third display module 30, so that a suspended area will not exist in the third display module 30, thereby improving stability of the splicing display panel 100.

Figure 3:
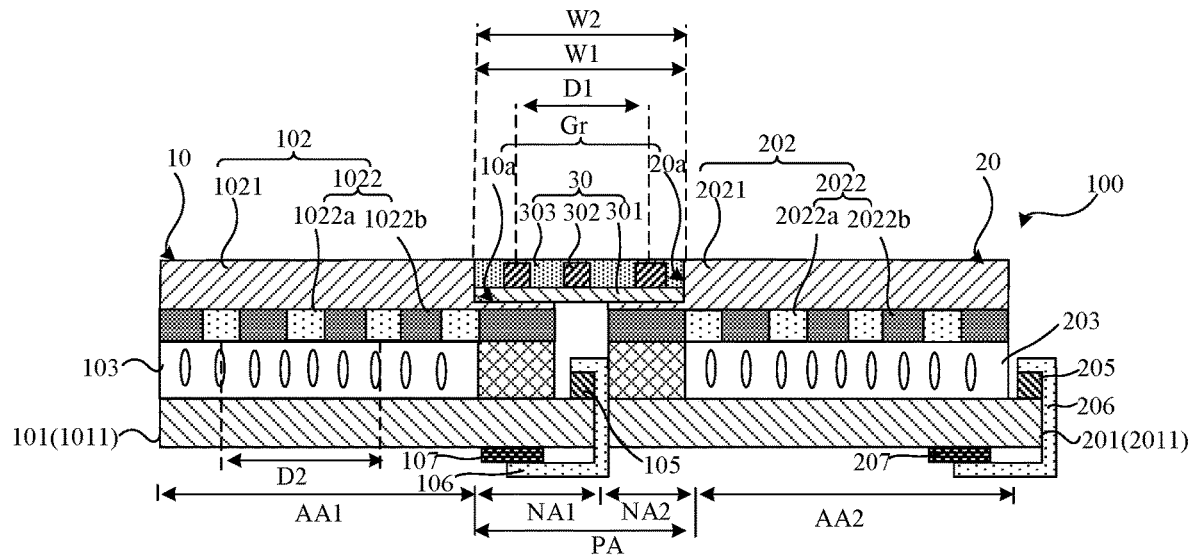
FIG. 3 is a second schematic structural diagram of the splicing display panel provided by an embodiment of the present application.

Please refer to FIG. 3, FIG. 3 is a second schematic structural diagram of the splicing display panel provided by the present application. Differences between a splicing display panel 100 provided in the embodiment of the present application and the splicing display panel 100 provided in FIG. 2 are that the second display module 20 includes a second display area AA2 and a second frame area NA2. The second display module 20 includes a third substrate 201 and a fourth substrate 202 disposed opposite to the third substrate 201. The fourth substrate 202 has a second concave part 20a, the second concave part 20a is located in the second frame area NA2, and an opening of the second concave part 20a is provided on a light-emitting side of the second display module 20, the first concave part 10a and the second concave part 20a surround to form a holding groove Gr, and the third display module 30 is disposed in the holding groove Gr. In the splicing display panel 100 provided by the embodiment of the present application, the first concave part 10a and the second concave part 20a surround to form the holding groove Gr, and the third display module 30 is disposed in the holding groove Gr, therefore, the first display module 10 and the second display module 20 bear the third display module 30, so that the suspended area will not exist in the third display module 30, so as to alleviate a phenomenon of uneven display of the splicing display panel 100, thereby improving stability of the splicing display panel 100. In addition, since the third display module 30 is disposed in the holding groove Gr, a segment difference between the first display module 10 and the third display module 30 is reduced, so as to ensure flatness of a light-emitting surface of the splicing display panel 100 and alleviate shadow occurring at a seam PA, so as to reduce or even eliminate the seam PA of the splicing display panel 100, thereby improving display taste.

It should be noted that a gap S is defined at a splicing position of the first display module 10 and the second display module 20, the first frame area NA1 is spliced with the second frame area NA2 of an adjacent second display module 20 to form the seam PA, and the gap S is located in the seam PA.

Wherein the first concave part 10a and the second concave part 20a communicated with the gap S surround to form the holding groove Gr, and a width W1 of the holding groove Gr is equal to a width W2 of the third display module 30, so that the third display module 30 is clamped in the holding groove Gr; therefore, the third display module 30 will not shake, and the stability of the splicing display panel 100 can be improved.

Wherein the first display module 10 includes the first substrate 101, the second substrate 102 disposed opposite to the first substrate 101, and a first liquid crystal layer 103. The first liquid crystal layer 103 is disposed between the first substrate 101 and the second substrate 102, and the first liquid crystal layer 103 is located in the first display area AA1. The first concave part 10a is disposed on the second substrate 102, and the opening of the first concave part 10a is located on the light-emitting side of the first display module 10.

Specifically, the first substrate 101 is a driving substrate. The second substrate 102 is a color film substrate. The second substrate 102 includes a first base 1021 and a first color film layer 1022 disposed on a side of the first base 1021 close to the first substrate 101. The first color film layer 1022 includes first color filter layers 1022a and a first black matrix 1022b disposed between two of the first color filter layers 1022a. The first concave part 10a is located on the first base 1021.

The second display module 20 includes the third substrate 201, the fourth substrate 202 disposed opposite to the third substrate 201, and a second liquid crystal layer 203. The second liquid crystal layer 203 is disposed between the third substrate 201 and the fourth substrate 202, and the second liquid crystal layer 203 is located in the second display area AA2. The second concave part 20a is located on the fourth substrate 102, and the opening of the second concave part 20a is provided on the light-emitting side of the second display module 20.

Specifically, the third substrate 201 is a driving substrate. The fourth substrate 202 is a color film substrate. The fourth substrate 202 includes a second base 2021 and a second color film layer 2022 disposed on a side of the second base 2021 close to the third substrate 201, and the second color film layer 2022 includes second color filter layers 2022a and a second black matrix 2022b disposed between two of the second color filter layers 2022a. The second concave part 20a is located on the second base 2021.

It should be understood that the light-emitting side of the first display module 10 is a display surface of the first display module 10, and the light-emitting side of the second display module 20 is a display surface of the second display module 20.

The third display module 30 includes a driving circuit layer 301, a light-emitting diode (LED) chip 302 and a sealing glue 303 disposed on the driving circuit layer 301. The driving circuit layer 301 is disposed in the holding groove Gr. The LED chip 302 is disposed on a surface of the driving circuit layer 301 away from a bottom part of the holding groove Gr. The sealing glue 303 covers the LED chip 302.

In some embodiments, the driving circuit layer includes a driving substrate based on a printed circuit board (PCB), a driving substrate based on a glass, etc.

In the embodiment of the present application, the first display module 10 and the second display module 20 are liquid crystal display (LCD) modules. Since structures such as metal wires and black matrix need to be disposed in the first frame area NA1 of the first display module 10 and the second frame area NA2 of the second display module 20, when the first display module 10 and the second display module 20 are spliced, a large seam PA will be defined, which affects a visual effect. In the present application, the first concave part 10a is disposed on the first base 1021, and the second concave part 20a is disposed on the second base 2021; the first concave part 10a and the second concave part 20a surround to form the holding groove Gr, and the third display module 30 is disposed in the holding groove Gr and shields the seam PA, so that the suspended area will not exist in the third display module 30, so as to alleviate the phenomenon of the uneven display of the splicing display panel 100, thereby improving the stability of the splicing display panel 100. In addition, since the third display module 30 is disposed in the holding groove Gr, a segment difference among the first display module 10, the second display module 20, and the third display module 30 can be reduced, so as to ensure the flatness of the light-emitting surface of the splicing display panel 100 and alleviate the shadow occurring at the seam PA, thereby reducing or even eliminating the seam of the splicing display panel 100 and improving the display taste.

In some embodiments, the LED chip 302 can be a micro light-emitting diode (micro-LED) chip or a mini light-emitting diode (mini-LED) chip. By using small-sized light-emitting diodes such as micro-LEDs and mini-LEDs in the third display module 30 to display, and by improving processes and panel design, a micro-LED light-emitting structure and a mini-LED light-emitting structure with smaller spacings can be made. When spacings of the light-emitting diodes of the micro-LED light-emitting structure and the mini-LED light-emitting structure are reduced, on one hand, it can achieve higher resolution display in a narrow seam and enhance a display effect; on another hand, it can achieve a borderless effect visually, be better integrated with the first display module 10, and make a display screen more continuous and complete.

In some embodiments, a pixel spacing D1 of the third display module 30 is equal to a pixel spacing D2 of the first display module 10 and the second display module 20, so that resolution of the first display module 10, the second display module 20, and the third display module 30 are kept consistent, which further improves display quality of the splicing display panel 100.

In some embodiments, a side of the third display module 30 away from a bottom part of the first concave part 10a is flush with a side of the second substrate 102 away from the first substrate 10, which can effectively improve flatness of the light-emitting surface, and it is not easy for users to see a side of the second display module 20 from a view of a side angle, so as to alleviate a technical problem of shadow under the view of the side angle at the seam PA, thereby greatly improving the display taste.

Wherein manufacturing steps of the first concave part 10a include: firstly, the first base 1021 is scanned with a deep UV laser (the first base 1021 is a white glass without any process), wherein a scanning wavelength is 343 nm, scanning power is controlled ranging from 1 W to 5 W, and a scanning time is determined according to a process. A laser scanning end of the first base 1021 is immersed into a hydrofluoric acid container, film layers damaged by the laser are removed to form the first concave part 10a, and then the first base 1021 is aligned and attached with the first substrate 101.

In another embodiment, the manufacturing steps of the first concave part 10a can include: using a CO2 laser to scan the first base 1021 disposed on the first substrate 101, wherein a scanning wavelength is 355 nm, scanning power is controlled ranging from 3 W to 20 W, and a scanning time is determined according to a process to form the first concave part 10a.

Please continue to refer to FIG. 3, the first display module 10 also includes a first connecting pad 105, a first chip on film 106, and a first printed circuit board 107. Wherein the first connecting pad 105 is disposed on the first substrate 101 and corresponds to the first frame area NA1. The first chip on film 106 is connected to the first connecting pad 105. The first printed circuit board 107 is bonded onto a side of the first substrate 101 away from the second substrate 102 through the first chip on film 106, so as to achieve a narrow frame design of the first display module 10.

The second display module 20 also includes a second connecting pad 205, a second chip on film 206, and a second printed circuit board 207. Wherein the second connecting pad 205 is disposed on the third substrate 201 and corresponds to the second frame area NA2. The second chip on film 206 is connected to the second connecting pad 205. The second printed circuit board 207 is bonded onto a side of the third substrate 201 away from the fourth substrate 202 through the second chip on film 206, so as to achieve a narrow frame design of the second display module 20.

It should be noted that in the embodiment of the present application, the first display module 10 and the second display module 20 have a same structure. The present application distinguishes the first display module 10 from the second display module 20 for convenience of description.

Figure 4:
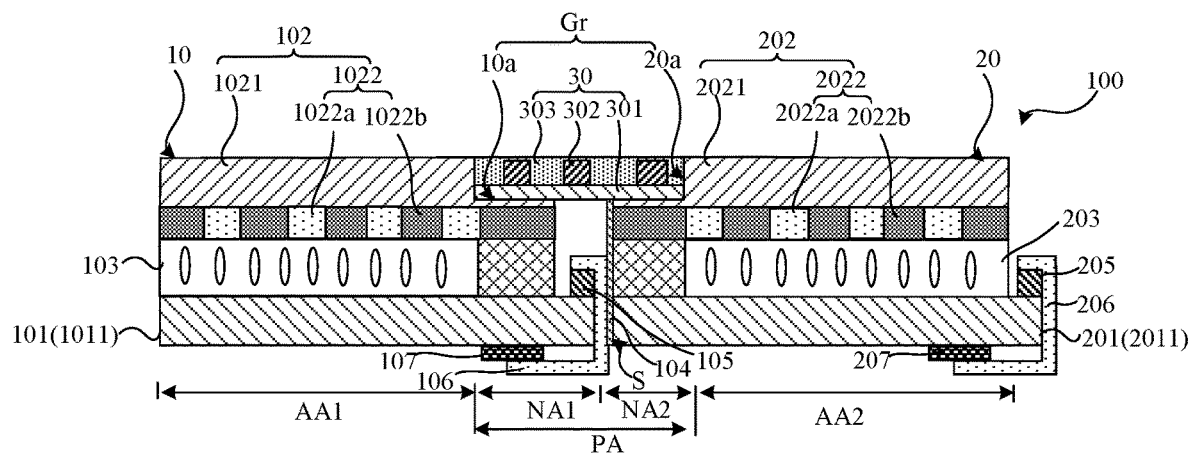
FIG. 4 is a third schematic structural diagram of the splicing display panel provided by an embodiment of the present application.

Please refer to FIG. 4, FIG. 4 is a third schematic structural diagram of the splicing display panel provided by an embodiment of the present application. Differences between a splicing display panel 100 provided in the embodiment of the present application and the splicing display panel 100 provided in FIG. 3 are that the splicing display panel 100 also includes an optically clear adhesive 104, and the optically clear adhesive 104 is filled in the gap S.

The gap S is filled with the optically clear adhesive (OCA) 104. When the optically clear adhesive 104 is used for a surface connection, it has higher strength. Moreover, the optically clear adhesive 104 has a high light transmittance, which can effectively eliminate the gap S.

It should be noted that the gap S is a small gap generated in a middle area when the first display module 10 and the second display module 20 are spliced. If the optically clear adhesive 104 is filled in the gap S, a more complete and continuous picture can be displayed. Therefore, the optically clear adhesive 104 not only can ensure stability of connection between two adjacent ones the first display module 10 and the second display module 20, but also can make a surface of a product smoother, which can prevent a problem of an uneven thickness, thereby improving the display effect of the splicing display panel 100.

In some embodiments, materials of the optically clear adhesive 104 are selected from one or any combination of organic silica gel, acrylic glue, epoxy sealant, and polyurethane glue. In the present application, since polymer materials have high viscosity, high density, and high light transmittance, the embodiment of the present application selects optical materials with a high water oxygen barrier ability, such as organic silica gel, acrylic glue, epoxy sealant, and polyurethane glue, and the above optical materials have excellent optical performance while having the high water oxygen barrier ability. The optically clear adhesive 104 provided by the embodiment of the present application can be directly attached to two adjacent ones of frame areas without introducing an adhesive layer.

Figure 5:
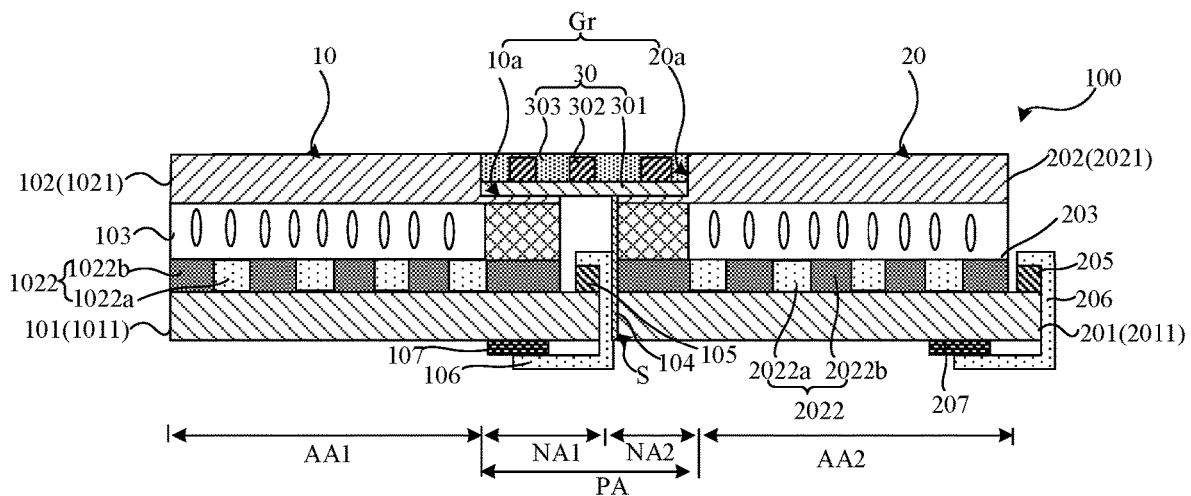
FIG. 5 is a fourth schematic structural diagram of the splicing display panel provided by an embodiment of the present application.

Please refer to FIG. 5, FIG. 5 is a fourth schematic structural diagram of the splicing display panel provided by an embodiment of the present application. Differences between a splicing display panel 100 provided in the embodiment of the present application and the splicing display panel 100 provided in FIG. 3 are that the first color film layer 1022 is located on a side of the first substrate 101 close to the first liquid crystal layer 103, and the second color film layer 2022 is located on a side of the third substrate 201 close to the second liquid crystal layer 203. The second substrate 102 includes the first base 1021, the first base 1021 is a glass substrate, and the first concave part 10a is located on the glass substrate. The fourth substrate 202 includes the second base 2021, the second base 2021 is a glass substrate, and the second concave part 20a is located on the glass substrate.

In the embodiment of the present application, a color filter on array (COA) technology is adopted to improve a pixel aperture ratio of the splicing display panel 100.

Figure 6:
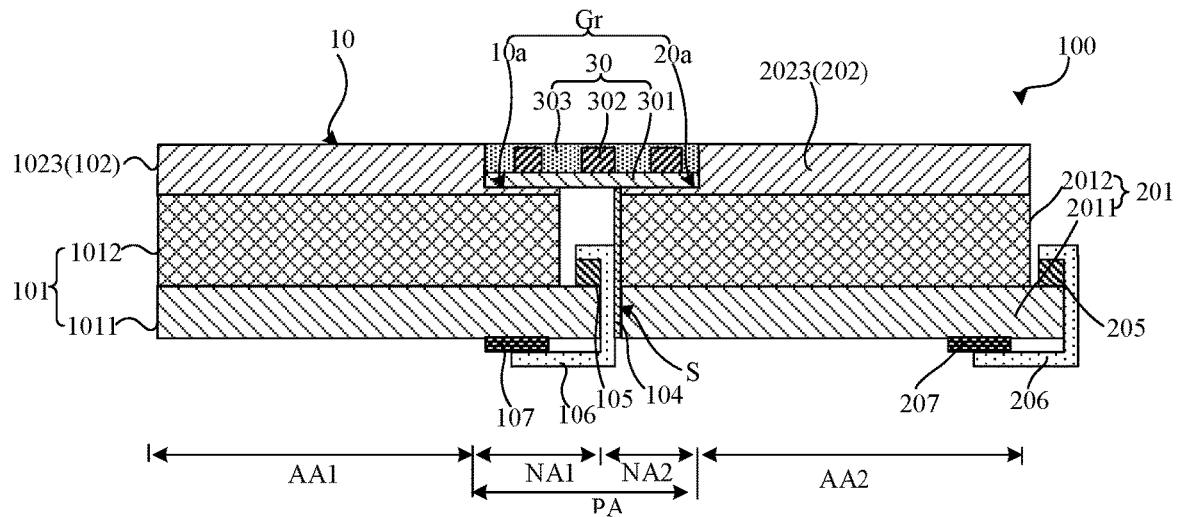
FIG. 6 is a fifth schematic structural diagram of the splicing display panel provided by an embodiment of the present application.

Please refer to FIG. 6, FIG. 6 is a fifth schematic structural diagram of the splicing display panel provided by an embodiment of the present application. Differences between a splicing display panel 100 provided in the embodiment of the present application and the splicing display panel 100 provided in FIG. 3 are that the first substrate 101 includes a first driving substrate 1011 and a first display functional layer 1012 disposed on the first driving substrate 1011; the second substrate 102 includes a first cover plate 1023, and the first concave part 10a is located on the first cover plate 1023. The third substrate 201 includes a second driving substrate 2011 and a second display functional layer 2012 disposed on the second driving substrate 2011; the fourth substrate 202 includes a second cover plate 2023, and the second concave part 20a is located on the second cover plate 2023.

It should be noted that in the embodiment of the present application, the first display functional layer 1012 and the second display functional layer 2012 are organic light-emitting diode (OLED) display functional layers.

Wherein the display functional layers include an anode, a pixel-definition layer, a light-emitting layer, and a cathode. Wherein the anode is connected to the driving substrate. The pixel-definition layer is disposed on the anode, the pixel-definition layer includes an opening, and the opening exposes a part of the anode. The light-emitting layer is limited in the opening, and the cathode is disposed on the pixel-definition layer.

In the embodiment of the present application, since metal wires need to be arranged in the first frame area NA1 of the first display module 10 and the second frame area NA2 of the second display module 20, when the first display module 10 and the second display module 20 are spliced, the large seam PA will be defined, which affects a visual effect. In the present application, the first concave part 10a is disposed on the first cover plate 1013, and the second concave part 20a is disposed on the second cover plate 2023; the first concave part 10a and the second concave part 20a surround to form the holding groove Gr, and the third display module 30 is disposed in the holding groove Gr and shields the seam PA, so that a suspended area will not exist in the third display module 30, so as to alleviate the phenomenon of the uneven display of the splicing display panel 100, thereby improving stability of the splicing display panel 100. In addition, since the third display module 30 is disposed in the holding groove Gr, a segment difference among the first display module 10, the second display module 20, and the third display module 30 is reduced, so as to ensure flatness of the light-emitting surface of the splicing display panel 100 and alleviate shadow occurring at the seam PA, thereby reducing or even eliminating the seam of the splicing display panel 100, which can improve the display taste.

The splicing display panel provided by the embodiment of the present application includes the at least one first display module and the at least one second display module spliced with each other, and the at least one third display module. The first display module includes the first display area and the first frame area disposed outside the first display area. The first display module includes the first substrate and the second substrate disposed opposite to the first substrate. The second substrate has the first concave part, the first concave part is located in the first frame area, and the opening of the first concave part is provided on the light-emitting side of the first display module. The at least one third display module is disposed in the first concave part.

In the embodiment of the present application, the first display module includes the first substrate and the second substrate; the second substrate has the first concave part, the first concave part is located in the first frame area, and the third display module is disposed in the first concave part; therefore, the first display module bears the third display module, so that the suspended area will not exist in the third display module, thereby improving the stability of the splicing display panel.

To sum up, although the present application has been disclosed as above in preferred embodiments, the above preferred embodiments are not intended to limit the present application. Ordinary technicians in the art can make various changes and refinements without departing from a spirit and a scope of the present application. Therefore, the scope of protection of the present application is subject to a scope defined in claims.

What is claimed is:

1. A splicing display panel, comprising:
at least one first display module and at least one second display module spliced with each other, wherein the first display module comprises a first display area and a first frame area disposed outside the first display area, and the first display module comprises a first substrate and a second substrate disposed opposite to the first substrate; the second substrate has a first concave part, the first concave part is located in the first frame area, and an opening of the first concave part is provided on a light-emitting side of the first display module; and at least one third display module disposed in the first concave part;

wherein a gap is defined at a splicing position of the first display module and the second display module, the splicing display panel further comprises an optically clear adhesive, and the optically clear adhesive is filled in the gap.

2. The splicing display panel according to claim 1, wherein the second display module comprises a second display area and a second frame area, and the second display module comprises a third substrate and a fourth substrate disposed opposite to the third substrate; the fourth substrate has a second concave part, the second concave part is located in the second frame area, and an opening of the second concave part is provided on a light-emitting side of the second display module; the first concave part and the second concave part surround to form a holding groove, and the third display module is disposed in the holding groove.

3. The splicing display panel according to claim 2, wherein the first substrate and the third substrate are driving substrates, and the second substrate and the fourth substrate are color film substrates; the second substrate comprises a first base and a first color film layer disposed on a side of the first base close to the first substrate, and the first base has the first concave part; the fourth substrate comprises a second base and a second color film layer disposed on a side of the second base close to the third substrate, and the second base has the second concave part.

4. The splicing display panel according to claim 3, wherein the first display module further comprises a first liquid crystal layer, the first liquid crystal layer is disposed between the first substrate and the second substrate, and the first liquid crystal layer is located in the first display area; the second display module further comprises a second liquid crystal layer, the second liquid crystal layer is disposed between the third substrate and the fourth substrate, and the second liquid crystal layer is located in the second display area.

5. The splicing display panel according to claim 2, wherein the first substrate comprises a first driving substrate and a first display functional layer disposed on the first driving substrate, the second substrate comprises a first cover plate, and the first concave part is located on the first cover plate; the third substrate comprises a second driving substrate and a second display functional layer disposed on the second driving substrate, the fourth substrate comprises a second cover plate, and the second concave part is located on the second cover plate.

6. The splicing display panel according to claim 2, wherein the third display module comprises a driving circuit layer and a light-emitting diode (LED) chip disposed on the driving circuit layer, the driving circuit layer is disposed in the holding groove, and the LED chip is disposed on a surface of the driving circuit layer away from a bottom part of the holding groove.

7. The splicing display panel according to claim 6, wherein the third display module further comprises a sealing glue, and the sealing glue covers the LED chip.

8. The splicing display panel according to claim 2, wherein a pixel spacing of the third display module is equal to a pixel spacing of the first display module and the second display module.

9. The splicing display panel according to claim 2, wherein a width of the holding groove is equal to a width of the third display module.

10. The splicing display panel according to claim 1, wherein a side of the third display module away from a bottom part of the first concave part is flush with a side of the second substrate away from the first substrate.

11. A splicing display panel, comprising:

at least one first display module and at least one second display module spliced with each other, wherein the first display module comprises a first display area and a first frame area disposed outside the first display area, and the first display module comprises a first substrate, a second substrate disposed opposite to the first substrate, and a first liquid crystal layer disposed between the first substrate and the second substrate; the second substrate comprises a first base and a first color film layer disposed on a side of the first substrate close to the first liquid crystal layer, the first base has a first concave part, the first concave part is located in the first frame area, and an opening of the first concave part is provided on a light-emitting side of the first display module; and at least one third display module disposed in the first concave part.

12. The splicing display panel according to claim 11, wherein the second display module comprises a second display area and a second frame area, and the second display module comprises a third substrate, a fourth substrate disposed opposite to the third substrate, and a second liquid crystal layer disposed between the third substrate and the fourth substrate; the fourth substrate comprises a second base and a second color film layer disposed on a side of the second base close to the second liquid crystal layer, and the second base has a second concave part, the second concave part is located in the second frame area, and an opening of the second concave part is provided on a light-emitting side of the second display module; the first concave part and the second concave part surround to form a holding groove, and the third display module is disposed in the holding groove.

13. The splicing display panel according to claim 12, wherein the first liquid crystal layer is located in the first display area, and the second liquid crystal layer is located in the second display area.

14. The splicing display panel according to claim 12, wherein the third display module comprises a driving circuit layer and an LED chip disposed on the driving circuit layer, the driving circuit layer is disposed in the holding groove, and the LED chip is disposed on a surface of the driving circuit layer away from a bottom part of the holding groove.

15. The splicing display panel according to claim 14, wherein the third display module further comprises a sealing glue, and the sealing glue covers the LED chip.

16. The splicing display panel according to claim 11, wherein a pixel spacing of the third display module is equal to a pixel spacing of the first display module and the second display module.

17. The splicing display panel according to claim 11, wherein a gap is defined at a splicing position of the first display module and the second display module, the splicing display panel further comprises an optically clear adhesive, and the optically clear adhesive is filled in the gap.

18. The splicing display panel according to claim 11, wherein a side of the third display module away from a bottom part of the first concave part is flush with a side of the second substrate away from the first substrate.

19. The splicing display panel according to claim 12, wherein a width of the holding groove is equal to a width of the third display module.

\* \* \* \* \*